United States Patent
Schneegans et al.

(10) Patent No.: US 8,736,054 B2
(45) Date of Patent: May 27, 2014

(54) MULTILAYER METALLIZATION WITH STRESS-REDUCING INTERLAYER

(75) Inventors: Manfred Schneegans, Vaterstetten (DE); Jürgen Förster, Tegernheim (DE)

(73) Assignee: Infineon Technologies AG, Neubiberg (DE)

( * ) Notice: Subject to any disclaimer, the term of this patent is extended or adjusted under 35 U.S.C. 154(b) by 47 days.

(21) Appl. No.: 13/192,376

(22) Filed: Jul. 27, 2011

(65) Prior Publication Data

US 2013/0026633 A1    Jan. 31, 2013

(51) Int. Cl.
*H01L 23/48* (2006.01)
*H01L 21/44* (2006.01)

(52) U.S. Cl.
USPC ........... 257/750; 257/758; 257/762; 257/763; 257/773; 257/775; 257/E21.575; 438/614; 438/622; 438/625; 438/648; 438/649; 438/687

(58) Field of Classification Search
USPC ......... 257/750, 751, 754, 761, 763, 764, 770, 257/773, 758, E23.16, E23.142, E21.584, 257/E21.575; 438/625, 627, 643, 653
See application file for complete search history.

(56) References Cited

U.S. PATENT DOCUMENTS

| | | | |
|---|---|---|---|
| 6,455,418 B1 * | 9/2002 | Bhowmik et al. | 438/643 |
| 7,112,507 B2 * | 9/2006 | Kim et al. | 438/396 |
| 7,413,984 B2 * | 8/2008 | Catabay et al. | 438/687 |
| 7,687,909 B2 * | 3/2010 | Ding et al. | 257/751 |
| 2006/0035458 A1 * | 2/2006 | Nelle et al. | 438/624 |
| 2007/0267749 A1 | 11/2007 | Stecher et al. | |

* cited by examiner

*Primary Examiner* — Jasmine Clark
(74) *Attorney, Agent, or Firm* — Murphy, Bilak & Homiller, PLLC

(57) ABSTRACT

A wiring structure for a semiconductor device includes a multilayer metallization having a total thickness of at least 5 µm and an interlayer disposed in the multilayer metallization with a first side of the interlayer adjoining one layer of the multilayer metallization and a second opposing side of the interlayer adjoining a different layer of the multilayer metallization. The interlayer includes at least one of W, WTi, Ta, TaN, TiW, and TiN or other suitable compound metal or a metal silicide such as WSi, MoSi, TiSi, and TaSi.

27 Claims, 4 Drawing Sheets

MULTILAYER METALLIZATION WITH STRESS-REDUCING INTERLAYER

TECHNICAL FIELD

The present application relates to thick wiring layers for semiconductor devices, in particular reducing stress induced by thick wiring layers.

BACKGROUND

Thick Cu films (e.g. 5 to 50 µm thick) used as last metal layers in power semiconductor applications exert a strong tensile stress due to the thermal expansion mismatch between Cu and semiconductor substrates such as Si wafers. The tensile is problematic above room temperature and down to −50° C. or −70° C., resulting in a heavy wafer bow. A bowed wafer causes out-of-focus issues for lithography stepper systems and therefore limits the use of additional lithography processes. In addition, the wafer bow increases after wafer thinning. Further processing of bowed wafers proves very difficult.

The thickness of conventional Cu last metal layers is typically below 12 µm to minimize the wafer bowing problem described above. The wafer can be cooled significantly (e.g. <=−70° C.) to reduce the wafer bow. However, thicker Cu layers (e.g. >20 µm) are needed to support advanced device technologies. Also, the effect of wafer cryo-cooling is lost when the wafer is subsequently annealed at temperatures >130° C. because the original wafer bow returns at these temperatures. Such elevated temperatures already occur during a standard prebake step of lithographic resists.

SUMMARY

Embodiments described herein relate to the formation of a thick metallization containing one or more interlayers which reduce or eliminate the tensile stress exerted by the metallization on the underlying semiconductor substrate and increase thermo-mechanical stability. The interlayer can comprise any conductive or semi-conductive material which exerts a stress that at least partly counteracts the stress exerted by the metallization on the underlying semiconductor substrate at room temperature and above. For example, both Cu and Al exert a tensile (expansive) stress on Si wafers at room temperature and above and the interlayer exerts a compressive stress which counteracts this tensile stress.

According to an embodiment of a wiring structure for a semiconductor device, the wiring structure includes a multilayer metallization having a total thickness of at least 5 µm and an interlayer disposed in the multilayer metallization with a first side of the interlayer adjoining one layer of the multilayer metallization and a second opposing side of the interlayer adjoining a different layer of the multilayer metallization. The interlayer comprises at least one of W, WTi, Ta, TaN, TiW, TiN, a metal silicide, WSi, MoSi, TiSi, and TaSi.

According to another embodiment of wiring structure for a semiconductor device, the wiring structure includes a multilayer metallization having a total thickness of at least 5 µm and an interlayer disposed in the multilayer metallization with a first side of the interlayer adjoining a first portion of the multilayer metallization and a second opposing side of the interlayer adjoining a different portion of the multilayer metallization. The interlayer exerts a stress which at least partly counteracts the stress exerted by the multilayer metallization at room temperature and above.

According to an embodiment of a method of manufacturing a wiring structure for a semiconductor device, the method includes forming a multilayer metallization over a semiconductor device region disposed on a semiconductor substrate. The multilayer metallization has a total thickness of at least 5 µm. The method further includes disposing an interlayer in the multilayer metallization with a first side of the interlayer adjoining one layer of the multilayer metallization and a second opposing side of the interlayer adjoining a different layer of the multilayer metallization. The interlayer comprises at least one of W, WTi, Ta, TaN, TiW, TiN, a metal silicide, WSi, MoSi, TiSi, and TaSi.

According to another embodiment of a method of manufacturing a wiring structure for a semiconductor device, the method includes forming a multilayer metallization over a semiconductor device region disposed on a semiconductor substrate. The multilayer metallization has a total thickness of at least 5 µm. The method further includes disposing an interlayer in the multilayer metallization with a first side of the interlayer adjoining a first portion of the multilayer metallization and a second opposing side of the interlayer adjoining a different portion of the multilayer metallization. The interlayer exerts a stress which at least partly counteracts the stress exerted by the multilayer metallization on the substrate at room temperature and above.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Figure 1:
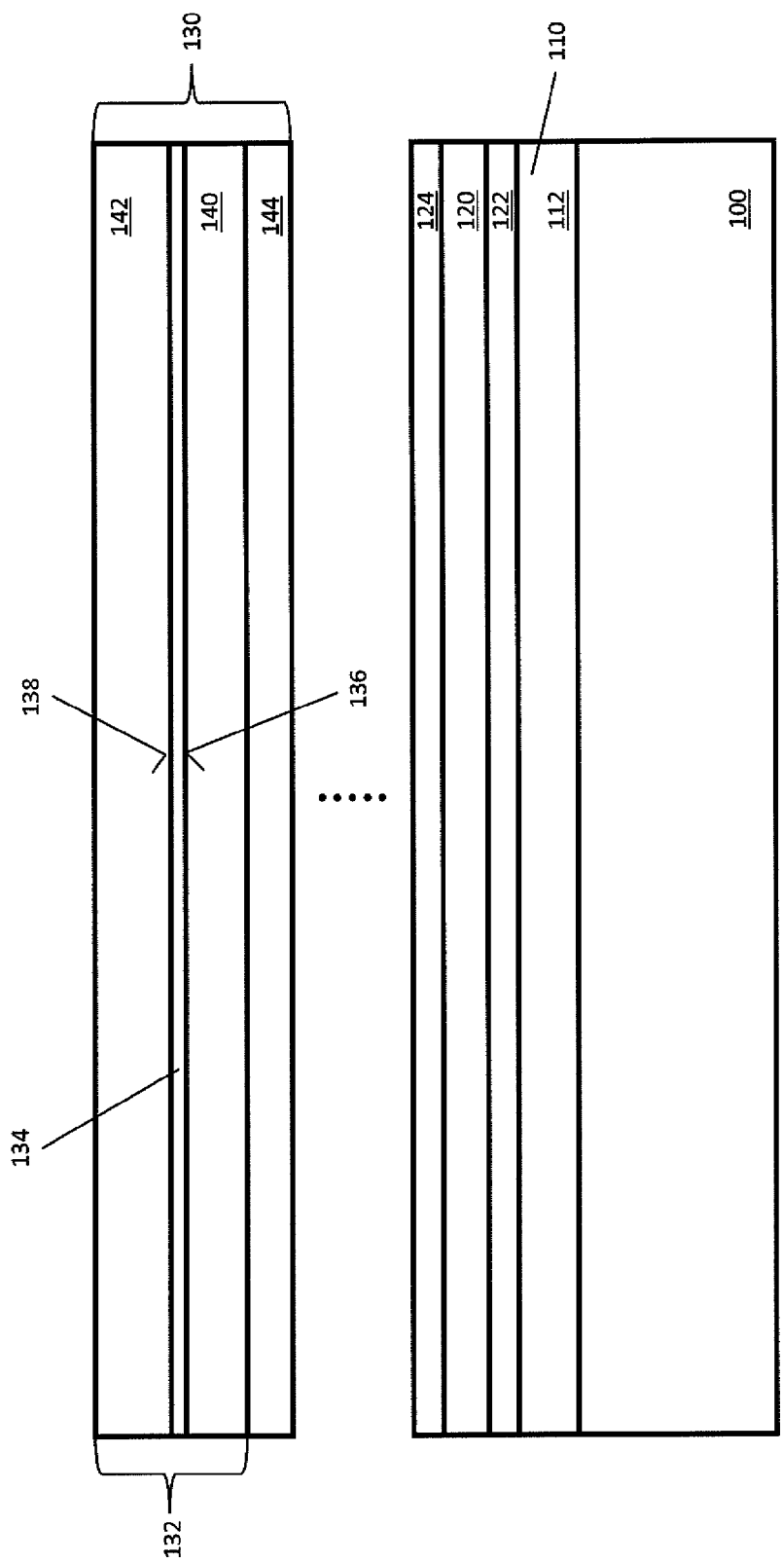
FIG. 1 illustrates a schematic side view of a semiconductor substrate with an active device region and a multilayer wiring structure disposed over the active device region according to an embodiment.

FIG. 1 illustrates an embodiment of a semiconductor substrate 100 after formation of an active device region 110 on the substrate 100 and one or more wiring layers disposed over the device region 110. The substrate 100 can be any type of semiconductor substrate such as a wafer made of Si, SOI (silicon on insulator), SiC, GaAs, GaN, Ge, InP, etc. The device region 110 can include any type of active device (e.g. transistors, diodes, etc.) and/or passive device (e.g. capacitors, resistors, inductors, etc.). The device region 110 can formed in the bulk substrate 100 (e.g. in a well structure) or in an epitaxial layer 112 grown on the substrate 100 using well known processes. Interconnections to the active device region 110 are formed by the wiring layers disposed above the active device region 110. For example, a lowermost wiring layer 120 is formed above the active device region 110 and separated from the device region 110 by an insulating layer 122 e.g. made of a dielectric. One or more additional intermediary wiring layers (not shown) can also be provided as indicated by the dashed line and separated from one another by respective insulating layers 124. The lower wiring layer(s) 120 can be made of Cu or Al.

The uppermost wiring structure 130 includes a multilayer metallization 132 having no dielectric layers and a total thickness of at least 5 µm, e.g. of at least 12 µm, e.g. of at least 20 µm. The uppermost wiring structure 130 also includes an interlayer 134 disposed in the multilayer metallization 132 with a first side 136 of the interlayer 134 adjoining a first portion or layer 140 of the multilayer metallization 132 and a second opposing side 138 of the interlayer 134 adjoining a different portion or layer 142 of the multilayer metallization 132. The interlayer 134 exerts a stress which at least partly counteracts the stress exerted by the multilayer metallization 132 on the underlying semiconductor substrate 100 at room temperature and above. For example, the multilayer metallization 132 can be made of Cu or Al. Both Cu and Al exert a tensile (expansive) stress on Si wafers at room temperature and above and the interlayer 134 exerts a compressive stress which counteracts this tensile stress. This way, the tensile stress exerted by the multilayer metallization 132 is at least reduced or even eliminated by including one or more interlayers 134 in the multilayer metallization 132. This enables the use of subsequent lithography processes which would otherwise be difficult to use due to out-of-focus issues caused by substrate bowing. By appropriately choosing the quantity, composition and thickness of the interlayers 134, the net stress exerted on the semiconductor substrate 100 by the uppermost wiring structure 130 can even be made compressive instead of tensile if desired. For a Si wafer (substrate) and Cu multilayer metallization 132, the interlayer 134 preferably comprises WTi. Other compressive materials which are at least partly conductive and exert a compressive stress can be used instead for the interlayer 134 e.g. such as W, WTi, Ta, TaN, TiW, and TiN or other suitable compound metal or a metal silicide such as WSi, MoSi, TiSi, and TaSi.

The uppermost wiring structure 130 can also include a lower layer 144 on which the multilayer metallization 132 is disposed. The lower layer 144 is spaced apart from the interlayer 134 by a portion or layer(s) 140 of the multilayer metallization 132. In one embodiment, the lower layer 144 is of the same composition as the interlayer 134.

Figure 2:
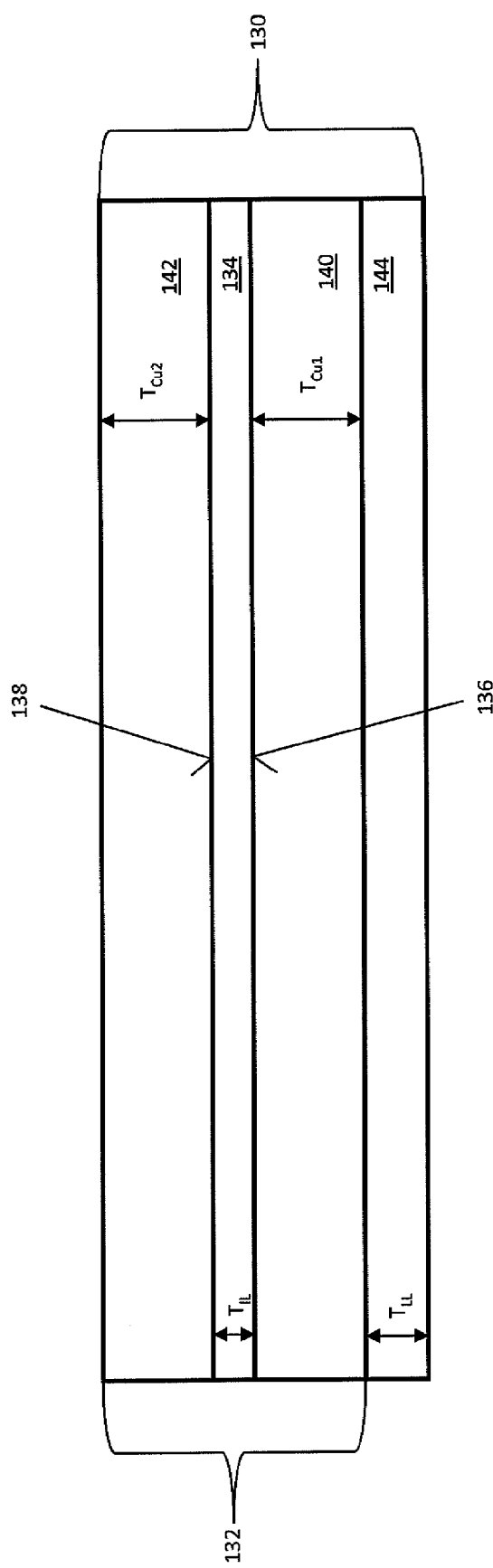
FIG. 2 illustrates a schematic side view of a multilayer wiring structure according to an embodiment.

FIG. 2 illustrates the uppermost wiring structure 130 in more detail. According to this embodiment, a single interlayer 134 is disposed in the multilayer metallization 132. The single interlayer 134 has a thickness ($T_{IL}$) of between 20 nm and 500 nm if made of WTi, the lower layer 144 has a thickness ($T_{LL}$) of at least 200 nm and the multilayer metallization 132 is at least 5 µm thick according to this embodiment. For example, the WTi interlayer 134 can be about 150 nm thick and the lower layer 144 can be about 300 nm thick and also made of WTi. The portion or layer 140 of the multilayer metallization 132 interposed between the bottom side 136 of the interlayer 134 and the lower layer 144 can be at least 1 µm thick, e.g. about 2.5 µm thick ($T_{c1}$). The portion or layer 142 of the multilayer metallization 132 disposed on the top side 138 of the interlayer 134 can have the same thickness ($T_{c2}$) as the lower layer 140, e.g. about 2.5 µm.

The multilayer metallization 132 can be formed using a physical vapor deposition (PVD) process or an electroplating process. With PVD, a tool and vacuum are used to deposit the multilayer metallization 132 and form the interlayer 134 within the metallization 132. The PVD tool may have different targets in one chamber or one chamber per target i.e. a so-called cluster tool. Electroplating is a more difficult process option because of the interlayer formation, but is still a feasible alternative to PVD.

Figure 3:
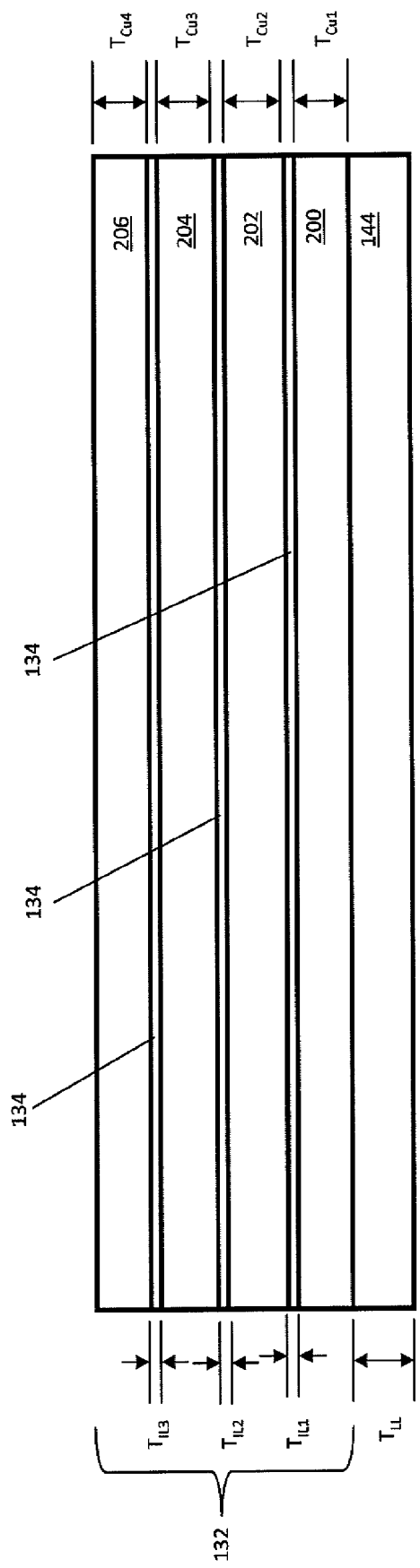
FIG. 3 illustrates a schematic side view of a multilayer wiring structure according to another embodiment.

FIG. 3 illustrates another embodiment of the uppermost wiring structure 130. According to this embodiment, three interlayers 134 are disposed in the multilayer metallization 132. As such, the multilayer metallization 132 has four different Cu layers 200, 202, 204, 206 with adjacent layers being separated by one of the interlayers 134. In one embodiment, each interlayer 134 comprises WTi and is about 50 nm thick ($T_{IL1-3}$) and the lower layer 144 is about 300 nm thick ($T_{LL}$) and also made of WTi. Each layer 200, 202, 204, 206 of the multilayer metallization 132 is about 1.25 µm thick ($T_{Cu1-4}$). However, one or more of the interlayers 134 can have different thicknesses. One or more layers 200, 202, 204, 206 of the multilayer metallization 132 likewise can have different thicknesses. In each case, the thickness of the interlayers 134 and the thickness of the metallization layers 200, 202, 204, 206 are selected to provide the desired stress compensation effect e.g. a reduced over tensile stress on the underlying semiconductor substrate (not shown in FIG. 3) or even a net compressive stress exerted on the substrate. The multilayer metallization 132 can be formed using a PVD or electroplating process as described above.

Figure 4:
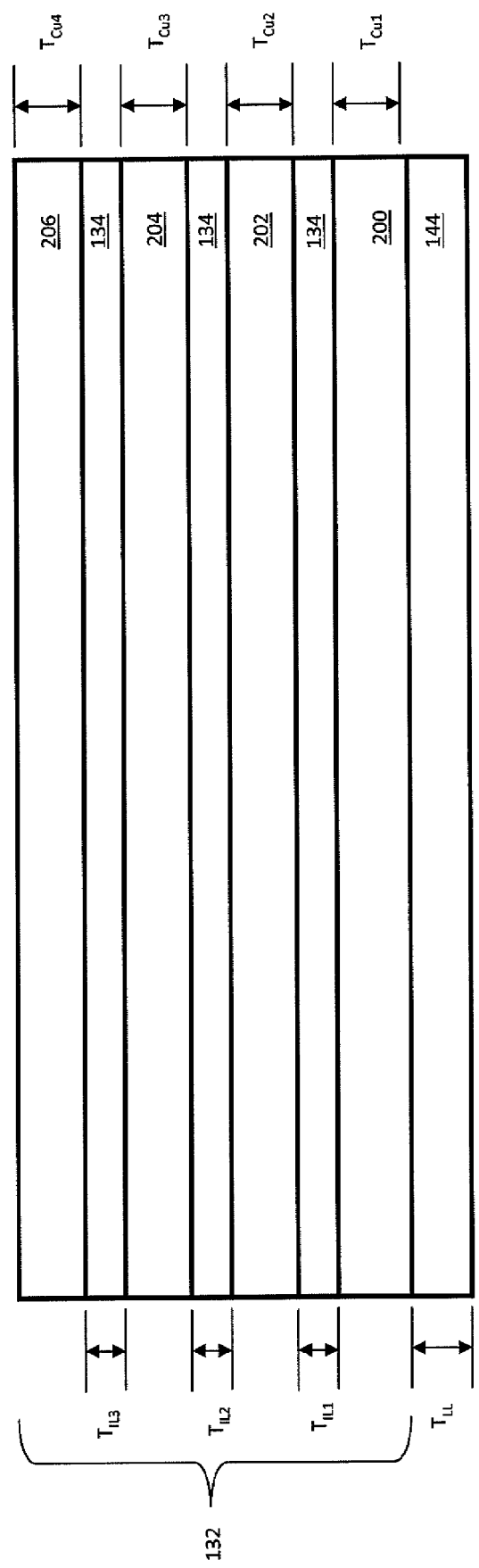
FIG. 4 illustrates a schematic side view of a multilayer wiring structure according to yet another embodiment.

FIG. 4 illustrates yet another embodiment of the uppermost wiring structure 130. The embodiment shown in FIG. 4 is similar to the one shown in FIG. 3, but with the interlayers 134 being thicker. According to this embodiment, each interlayer 134 comprises WTi and is about 150 nm thick ($T_{IL1-3}$) and the lower layer 144 is about 300 nm thick ($T_{LL}$) and also made of WTi. Each layer 200, 202, 204, 206 of the multilayer metallization 132 is about 1.25 µm thick ($T_{Cu1-4}$). One or more of the interlayers 134 can have different thicknesses, as can one or more of the metallization layers 200, 202, 204, 206.

In general, one or more stress-counteracting interlayers 134 can be disposed in the multilayer metallization 132 of the wiring structure 130. For example, one, two, three, four or more interlayers 134 of the same or different thickness can be disposed in the multilayer metallization 132. The interlayers 134 exert a compressive stress. For Cu metallization 132, the interlayers 134 suitably adhere to Cu. Preferably, the interlayer(s) 134 react only near the interfaces with Cu. Sputtered WTi fulfils such requirements. For example, Cu will not alloy into an interlayer 134 made of WTi from the multilayer metallization 132 and W likewise will not alloy into the multilayer metallization 132 from the WTi interlayer 134. Also, WTi exerts a compressive stress and adheres well to Cu. Other materials which are electrically conductive and exert a compressive stress such as W, Ta, TaN, TiW, and TiN, or other suitable compound metals or a metal silicide such as WSi, MoSi, TiSi, and TaSi can be used for the interlayer 134 instead of WTi. Thicknesses of the interlayer(s) 134 are preferably in the range of 50 to 500 nm for WTi. There is no theoretical limitation for the thickness of the multilayer metallization 132, only practical limitations. As such, the multilayer metallization 132 can be relatively thick (e.g. >5 µm, e.g. >12 µm, e.g. >20 µm) for high-power applications. The wiring structure 130 with the multilayer metallization 132 and the one or more interlayers 134 as described herein yields a multilevel structure with sequences of several Cu/Al and stress-counteracting layers. The last metal layer 142, 206 of the multilayer metallization 132 contains Cu for Cu metallization and Al for Al metallization and can be used for interconnections such as wire bonding.

The semiconductor substrate 100 can be annealed after the multilayer metallization 132 and the interlayer(s) 134 are formed. The annealing process is performed e.g. to stabilize Cu in the multilayer metallization 132 and can reach or exceed 400° C. Less tensile stress or even a compressive stress is exerted on the substrate 100 after the annealing process as compared to before annealing when the interlayer(s) 134 described herein are embedded within the multilayer metallization 132. After the annealing process, wafer bow is reduced or even reversed. Final wafer bow can be e.g. tensile (concave), no-bow or compressive (convex). By segmenting the thick multilayer metallization 132 into several thinner layers 140, 142, 200, 202, 204, 206 separated by stress-counteracting interlayers 134, the elasticity at elevated temperatures increases and correlates with higher thermo-mechanical stability. Similar properties are given for thick Aluminium metallization as well.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A wiring structure for a semiconductor device, the wiring structure comprising:
   a multilayer metallization having a total thickness of at least 5 µm;
   an interlayer disposed in the multilayer metallization with a first side of the interlayer adjoining one layer of the multilayer metallization and a second opposing side of the interlayer adjoining a different layer of the multilayer metallization, the interlayer comprising at least one of W, WTi, Ta, TaN, TiW, TiN, a metal silicide, WSi, MoSi, TiSi, and TaSi; and
   wherein the layers of the multilayer metallization adjoining the interlayer each have a thickness greater than 1 µm.

2. The wiring structure of claim 1, further comprising a lower layer on which the multilayer metallization is disposed, the lower layer being spaced apart from the interlayer by a portion of the multilayer metallization.

3. The wiring structure of claim 1, further comprising at least one additional interlayer disposed in the multilayer metallization so that each interlayer is spaced apart from the other interlayers by a layer of the multilayer metallization, each additional interlayer including at least one of W, WTi, Ta, TaN, TiW, TiN, a metal silicide, WSi, MoSi, TiSi, and TaSi.

4. The wiring structure of claim 3, wherein at least two of the interlayers have different thicknesses.

5. The wiring structure of claim 3, wherein the multilayer metallization has a thickness of greater than 1 µm between adjacent ones of the interlayers.

6. The wiring structure of claim 1, wherein the interlayer is at least 20 nm thick and comprises WTi.

7. The wiring structure of claim 1, wherein the interlayer is between 20 nm and 500nm thick and comprises WTi.

8. The wiring structure of claim 1, wherein the multilayer metallization comprises Cu.

9. A wiring structure for a semiconductor device, the wiring structure comprising:
   a multilayer metallization having a total thickness of at least 5 µm;
   an interlayer disposed in the multilayer metallization with a first side of the interlayer adjoining a first portion of the multilayer metallization and a second opposing side of the interlayer adjoining a different portion of the multilayer metallization, the interlayer exerting a stress which at least partly counteracts the stress exerted by the multilayer metallization at room temperature and above; and
   wherein the portions of the multilayer metallization adjoining the interlayer each have a thickness greater than 1 µm.

10. The wiring structure of claim 9, wherein the interlayer is at least 20 nm thick.

11. The wiring structure of claim 10, wherein the interlayer comprises WTi.

12. The wiring structure of claim 10, wherein the interlayer is between 20 nm and 500nm thick.

13. The wiring structure of claim 12, wherein the interlayer comprises WTi.

14. The wiring structure of claim 9, further comprising at least one additional interlayer disposed in the multilayer metallization so that each interlayer is spaced apart from the other interlayers by a layer of the multilayer metallization, each additional interlayer exerting a stress which at least partly counteracts the stress exerted by the multilayer metallization at room temperature and above.

15. The wiring structure of claim 14, wherein the multilayer metallization has a thickness of greater than 1 µm between adjacent ones of the interlayers.

16. A method of manufacturing a wiring structure for a semiconductor device, the method comprising:
   forming a multilayer metallization over a semiconductor device region disposed on a semiconductor substrate, the multilayer metallization having a total thickness of at least 5 µm;
   disposing an interlayer in the multilayer metallization with a first side of the interlayer adjoining one layer of the multilayer metallization and a second opposing side of the interlayer adjoining a different layer of the multilayer metallization, the interlayer comprising at least one of W, WTi, Ta, TaN, TiW, TiN, a metal silicide, WSi, MoSi, TiSi, and TaSi; and
   wherein the layers of the multilayer metallization adjoining the interlayer are each formed to have a thickness of greater than 1 µm.

17. The method of claim 16, wherein the multilayer metallization comprises Cu and is formed using a physical vapor deposition process.

18. The method of claim 16, wherein the multilayer metallization comprises Cu and is formed using an electroplating process.

19. The method of claim 16, further comprising annealing the semiconductor substrate after the interlayer and the multilayer metallization are formed, with less tensile stress being exerted on the substrate after the annealing than before the annealing.

20. The method of claim 16, wherein the multilayer metallization comprises Cu and wherein the interlayer comprises W, comprising disposing the interlayer in the multilayer metallization without Cu alloying into the interlayer from the multilayer metallization and without W alloying into the multilayer metallization from the interlayer.

21. The method of claim 16, further comprising forming a lower layer over the semiconductor device region on which the multilayer metallization is disposed, the lower layer having the same composition as the interlayer.

22. The method of claim 16, further comprising disposing at least one additional interlayer in the multilayer metallization so that each interlayer is spaced apart from the other interlayers by a layer of the multilayer metallization, each additional interlayer comprising at least one of W, WTi, Ta, TaN, TiW, TiN, a metal silicide, WSi, MoSi, TiSi, and TaSi.

23. A method of manufacturing a wiring structure for a semiconductor device, the method comprising:
    forming a multilayer metallization over a semiconductor device region disposed on a semiconductor substrate, the multilayer metallization having a total thickness of at least 5 μm;
    disposing an interlayer in the multilayer metallization with a first side of the interlayer adjoining a first portion of the multilayer metallization and a second opposing side of the interlayer adjoining a different portion of the multilayer metallization, the interlayer exerting a stress which at least partly counteracts the stress exerted by the multilayer metallization on the substrate at room temperature and above; and
    wherein the portions of the multilayer metallization adjoining the interlayer are each formed to have a thickness of greater than 1 μm.

24. The method of claim 23, further comprising annealing the semiconductor substrate after the interlayer and the multilayer metallization are formed, with less tensile stress being exerted on the substrate after the annealing than before the annealing.

25. The method of claim 23, wherein the multilayer metallization comprises Cu and wherein the interlayer comprises W, comprising disposing the interlayer in the multilayer metallization without Cu alloying from the multilayer metallization into the interlayer and without W alloying from the interlayer into the multilayer metallization.

26. The method of claim 23, further comprising forming a lower layer over the semiconductor device region on which the multilayer metallization is disposed.

27. The method of claim 23, further comprising disposing at least one additional interlayer in the multilayer metallization so that each interlayer is spaced apart from the other interlayers by a layer of the multilayer metallization, each additional interlayer exerting a stress which at least partly counteracts the stress exerted by the multilayer metallization on the substrate at room temperature and above.

* * * * *